(12) United States Patent
Hsu et al.

(10) Patent No.: US 7,947,910 B2
(45) Date of Patent: May 24, 2011

(54) PRINTED CIRCUIT BOARD WITH REDUCED CROSSTALK EFFECT BETWEEN TRANSMISSION LINES THEREIN

(75) Inventors: Shou-Kuo Hsu, Taipei Hsien (TW);
Yu-Chang Pai, Taipei Hsien (TW);
Cheng-Shien Li, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 1020 days.

(21) Appl. No.: 11/759,239

(22) Filed: Jun. 7, 2007

(65) Prior Publication Data
US 2008/0041618 A1    Feb. 21, 2008

(30) Foreign Application Priority Data
Aug. 16, 2006   (CN) ............. 2006 1 0062133

(51) Int. Cl.
*H05K 1/11* (2006.01)
(52) U.S. Cl. .................. 174/262; 174/261; 361/794
(58) Field of Classification Search .......... 174/262–266; 361/792–795
See application file for complete search history.

(56) References Cited

U.S. PATENT DOCUMENTS

| | | | | |
|---|---|---|---|---|
| 5,039,824 A | * | 8/1991 | Takashima et al. | 174/33 |
| 5,414,393 A | * | 5/1995 | Rose et al. | 333/1 |
| 5,522,727 A | * | 6/1996 | Saito et al. | 439/65 |
| 6,072,699 A | * | 6/2000 | Horine | 361/777 |
| 6,842,344 B1 | | 1/2005 | Fix et al. | |

FOREIGN PATENT DOCUMENTS

JP    7245575 A    9/1995

* cited by examiner

*Primary Examiner* — Jeremy C Norris
(74) *Attorney, Agent, or Firm* — Frank R. Niranjan

(57) ABSTRACT

A printed circuit board includes a first signal layer, a second signal layer, a plurality of transmission lines respectively including first segments laid in parallel on the first signal layer and second segments laid in parallel on the second signal layer, and a plurality of vias, each via connecting the first segment with the second segment of a corresponding transmission line. One of the plurality of transmission lines has the first segment positioned in the middle of an array defined by the first segments of the plurality of transmission lines, and a second segment positioned in an outmost position of an array defined by the second segments of the plurality of transmission lines. The printed circuit board reduces the possibility of false action of electronic components coupled to transmission lines, which is caused by the crosstalk between transmission lines.

8 Claims, 3 Drawing Sheets

PRINTED CIRCUIT BOARD WITH REDUCED CROSSTALK EFFECT BETWEEN TRANSMISSION LINES THEREIN

BACKGROUND OF THE INVENTION

1. Field of the Invention

The present invention relates to printed circuit boards, and particularly to a routing scenario of transmission lines of a printed circuit board capable of reducing crosstalk effect between the transmission lines.

2. Description of Related Art

Advancements in the electronics industry have brought ever smaller printed circuit boards (PCB) with increasing numbers of components. As a result, a PCB with a limited area requires disposing denser transmission lines thereon. This narrows the spacing between transmission lines and increases the crosstalk between transmission lines, possibly causing electronic components coupled to the transmission lines to take false actions.

Referring to FIG. 3, a routing scenario of three transmission lines of a conventional PCB is illustrated. As shown, the PCB includes signal layers f1, f2, transmission lines a1, a2, a3, vias b1, b2, b3, c1, c2, c3, and two electronic components 100, 200 laid on the signal layer f1. The transmission lines a1, a2, a3 are firstly routed from the electronic component 100 and in parallel to each other on the signal layer f1, then subsequently their paths are shifted to the layer f2 after respectively passing through the vias b1, b2, b3, and then return to the layer f1 after respectively passing through the vias c1, c2, c3. Finally, the transmission lines a1, a2, a3 are coupled to the electronic component 200.

According to known electromagnetic theory, crosstalk received by a transmission line is directly proportional to the quantity and lengths of adjacent transmission lines, and inversely proportional to the spacing between the transmission line and adjacent transmission lines. In FIG. 3, for simplifying computing, suppose lengths of the transmission lines a1, a2, a3 routed on the signal layer f1 are L1, lengths of the transmission lines a1, a2, a3 routed on the signal layer f2 are L2, and the spacing between adjacent transmission lines a1, a2, and a2, and a3 is S, and L2=2*L1, the crosstalk XTKa1, XTKa2, XTKa3 received respectively by the transmission lines a1, a2, a3 are found using the following relational expressions:

$$XTKa1=XTKa3$$

$$XTKa3 \propto 2L1/S^2 + 2L1/(4S^2) + L2/S^2 + L2/(4S^2) = 2.5*L2/S^2$$

$$XTKa2 \propto 2L1/S^2 + 2L2/S^2 + 2L1/S^2 = 4*L2/S^2$$

As shown above, as spacing S increases, crosstalk reduces. However, with ever-smaller PCBs, increasing spacing between transmission lines is not practical.

What is needed, therefore, is a PCB with reduced crosstalk effect between transmission lines therein.

SUMMARY OF THE INVENTION

A printed circuit board designed for reducing the possibility of false actions of electronic components coupled to transmission lines, caused by crosstalk between transmission lines is provided. In a preferred embodiment, the printed circuit board includes a first signal layer, a second signal layer, a plurality of transmission lines respectively including first segments laid in parallel in a, b, c order on the first signal layer and second segments laid in parallel in b, a, c order on the second signal layer, and a plurality of vias, each via connecting the first segment with the second segment of a corresponding transmission line, one of the plurality of transmission lines having the first segment positioned in the middle of an array defined by the first segments of the plurality of transmission lines, and a second segment positioned in an outmost position of an array defined by the second segments of the plurality of transmission lines.

Other objects, advantages and novel features of the present invention will become more apparent from the following detailed description of preferred embodiment when taken in conjunction with the accompanying drawings, in which:

DETAILED DESCRIPTION OF THE INVENTION

Figure 1:
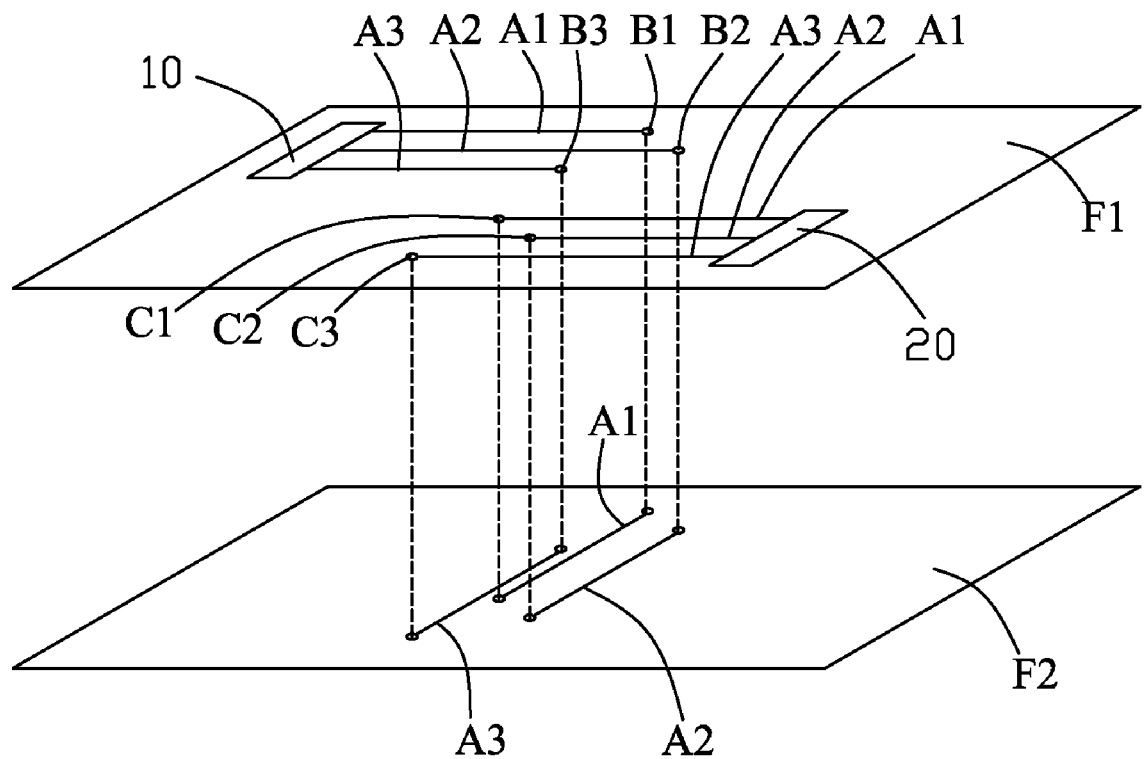
FIG. 1 is a schematic diagram of a printed circuit board, in accordance with a preferred embodiment of the present invention.

Referring to FIG. 1, a printed circuit board (PCB) in accordance with a preferred embodiment of the present invention includes signal layers F1, F2, transmission lines A1, A2, A3, vias B1, B2, B3, C1, C2, C3, and two electronic components 10, 20 laid on the signal layer F1. The transmission lines A1, A2, A3 connect the two electronic components 10, 20. The transmission lines A1, A2, A3 are firstly routed from the electronic component 10 in parallel to each other on the signal layer F1, then subsequently their paths are shifted to the signal layer F2 after respectively passing through the vias B1, B2, B3, and then return to the signal layer F1 after respectively passing through the vias C1, C2, C3. Finally, the transmission lines A1, A2, A3 are coupled to the electronic component 20. The vias B1, B2, B3, C1, C2, C3 are staggered. The segments of the transmission lines A1, A2, A3 between the electronic component 10 and the vias B1, B2, B3 on the signal layer F1 are arrayed in the following order: A1, A2, A3 along a first direction. The segments of the transmission lines A1, A2, A3 between the vias B1, B2, B3 and the vias C1, C2, C3 on the signal layer F2 are arrayed in the following order: A2, A1, A3 along a second direction. The segments of the transmission lines A1, A2, A3 between the vias C1, C2, C3 and the electronic component 20 on the signal layer F1 are arranged in the following order: A1, A2, A3 along the first direction.

For simplifying computing, suppose lengths of the transmission lines A1, A2, A3 routed on the signal layer F1 are L1, lengths of the transmission lines A1, A2, A3 routed on the signal layer F2 are L2, the spacing between adjacent transmission lines A1, A2, and A2, A3 is S, and L2=2*L1, the crosstalk XTKA1, XTKA2, XTKA3 received respectively by the transmission lines A1, A2, A3 are found using the following relational expressions:

$$XTKA1 \propto 2L1/S^2 + 2L1/(4S^2) + 2L2/S^2 = 3.25*L2/S^2$$

$$XTKA2 \propto 2L1/S^2 + L2/S^2 + L2/(4S^2) + 2L1/S^2 = 3.25*L2/S^2$$

$$XTKA3 \propto 2L1/S^2 + 2L1/(4S^2) + L2/S^2 + L2/(4S^2) = 2.5*L2/S^2$$

As shown, the greatest crosstalk XTKA1, XTKA2 is directly proportional to the expression $3.25*L2/S^2$. In conventional art, the greatest crosstalk XTKa2 is directly proportional to the expression $4*L2/S^2$. Compared to the conventional art, the greatest crosstalk received by three transmission lines of the present invention is 18.75% less. Therefore, the possibility of causing false action of electronic components 10, 20 coupled to the transmission lines A1, A2, A3 is reduced in the present invention.

Figure 2:
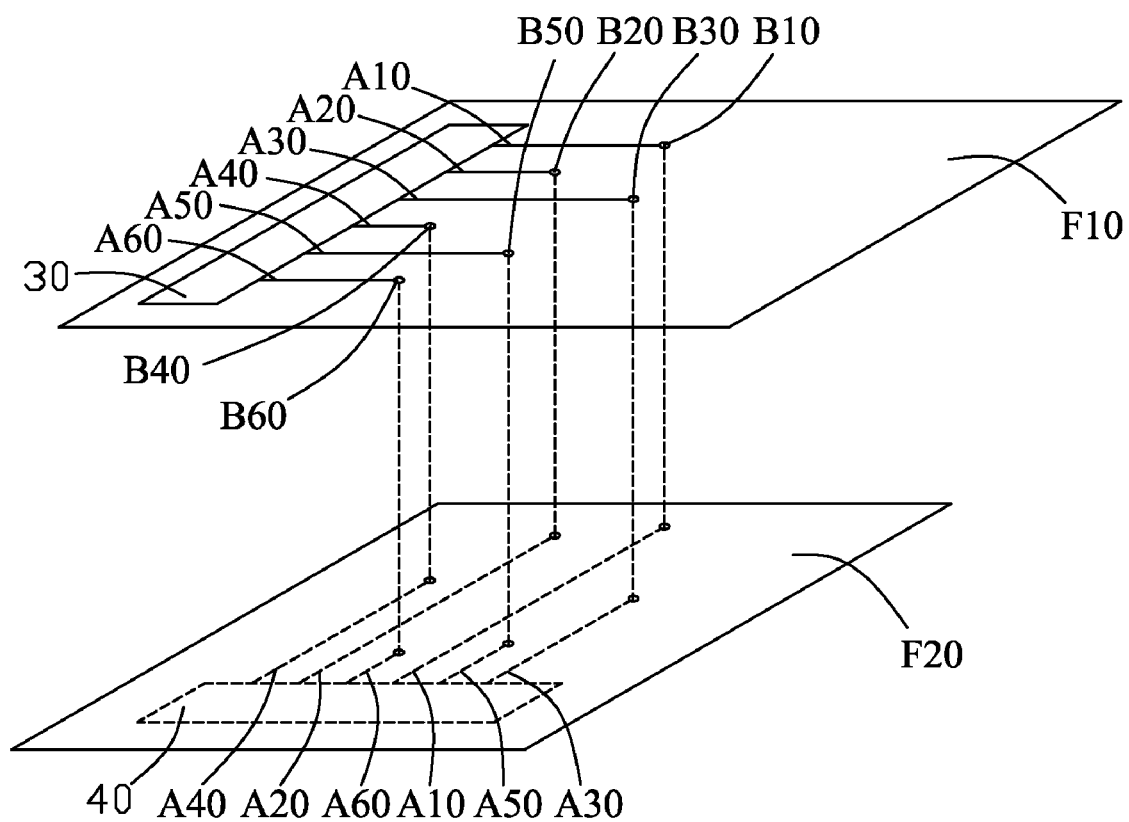
FIG. 2 is a schematic diagram of a printed circuit board, in accordance with another preferred embodiment of the present invention.
Figure 3:
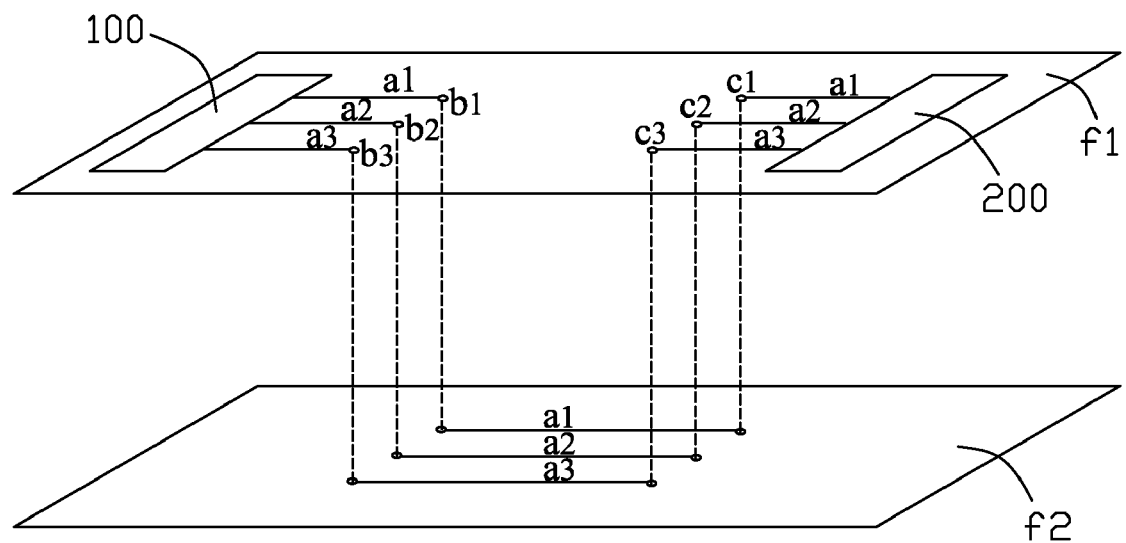
FIG. 3 is a routing scenario of three transmission lines of a conventional printed circuit board.

Referring to FIG. 2, a PCB in accordance with another preferred embodiment of the present invention includes signal layers F10, F20, transmission lines A10, A20, A30, A40, A50, A60, vias B10, B20, B30, B40, B50, B60, and two electronic components 30, 40 respectively laid on the signal layers F10, F20. The transmission lines A10, A20, A30, A40, A50, A60 connect the two electronic components 30, 40. The transmission lines A10, A20, A30, A40, A50, A60 are firstly routed from the electronic component 30 and in parallel to each other on the signal layer F10, then subsequently their paths are shifted to the signal layer F20 after respectively passing through the vias B10, B20, B30, B40, B50, B60. Finally, the transmission lines A10, A20, A30, A40, A50, A60 are coupled to the electronic component 40. The vias B10, B20, B30, B40, B50, B60 are staggered. The segments of the transmission lines A10, A20, A30, A40, A50, A60 between the electronic component 30 and the vias B10, B20, B30, B40, B50, B60 on the signal layer F10 are arranged in the following order: A10, A20, A30, A40, A50, A60 along the first direction. The segments of the transmission lines A10, A20, A30, A40, A50, A60 between the electronic component 40 and the vias B10, B20, B30, B40, B50, B60 on the signal layer F20 are arranged in the following order: A40, A20, A60, A10, A50, A30 along the second direction.

As shown in FIG. 1, the transmission line A2 has a first segment positioned in the middle of an array defined by the segments of the transmission lines A1, A2, A3 on the signal layer F1, and a second segment positioned in an outmost position of an array defined by the segments of the transmission lines A1, A2, A3 on the signal layer F2. As shown in FIG. 2, the transmission lines A30, A40 respectively have first segments positioned in the middle of an array defined by the segments of the transmission lines A10, A20, A30, A40, A50, A60 on the signal layer F10, and second segments positioned in the outmost position of an array defined by the segments of the transmission lines A10, A20, A30, A40, A50, A60 on the signal layer F20. As shown in the conventional art, a transmission line in the middle position suffers the greatest amount of crosstalk. Therefore, the crosstalk induced in the transmission lines A2 in FIG. 1, and A30, A40 in FIG. 2 is reduced by alternating their positioning from middle to outmost, thus reducing overall crosstalk induced in the transmission lines. The possibility of causing false action of corresponding electronic components is thus reduced.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A printed circuit board, comprising:
   a first signal layer;
   a second signal layer;
   a plurality of transmission lines respectively comprising first segments laid in parallel on the first signal layer, second segments laid in parallel on the second signal layer, and third segments laid in parallel on the first signal layer;
   a plurality of first vias, each first via connecting the first segment with the second segment of a corresponding transmission line; and
   a plurality of second vias, each second via connecting the second segment with the third segment of a corresponding transmission line;
   wherein one of the plurality of transmission lines has a first segment positioned in the middle of an array defined by the first segments of the plurality of transmission lines, and a second segment positioned in an outmost position of an array defined by the second segments of the plurality of transmission lines.

2. The printed circuit board as claimed in claim 1, further comprising two electronic components laid on the first signal layer, the plurality of transmission lines respectively connecting the two electronic components.

3. The printed circuit board as claimed in claim 1, wherein the plurality of first vias are staggered, and the plurality of second vias are staggered.

4. A printed circuit board (PCB), comprising:
   a plurality of first vias staggerly arranged between a first signal layer and a second signal layer of the PCB;
   a plurality of second vias staggerly arranged between the first signal layer and the second signal layer;
   a plurality of first transmission lines on the first signal layer, one end of each first transmission line connecting a corresponding first via on the first signal layer;
   a plurality of second transmission lines on the second signal layer, one end of each second transmission line connecting a corresponding first via on the second signal layer, and the other end of each second transmission line connecting a corresponding second via on the second layer; and
   a plurality of third transmission lines on the first signal layer, one end of each third transmission line connecting a corresponding second via on the second signal layer;
   wherein one of the plurality of first transmission lines, which is laid in a middle of an array defined by the plurality of first transmission lines, is laid in an outmost position of an array defined by the plurality of second transmission lines.

5. A printed circuit board, comprising:
   a first signal layer on which a first electronic component is mounted;
   a second signal layer;
   a plurality of transmission lines respectively comprising first segments laid in parallel on the first signal layer in a first direction and each connecting with and extending from the first electronic component in a second direction, second segments laid in parallel on the second signal layer in a third direction and each extending in a fourth direction, and third segments laid in parallel on the first signal layer in a fifth direction and each extending in a sixth direction;
   a plurality of first vias each connecting the first segment with the second segment of a corresponding transmission line; and
   a plurality of second vias each connecting the second segment with the third segment of a corresponding transmission line;

wherein a middle one of the first segments in the first direction connects with an outmost one of the second segments in the third direction and a middle one of the second segments in the third direction connecting with an outmost one of the first segments in the first direction.

6. The printed circuit board as claimed in claim 5, further comprising a second electronic component laid on the first signal layer and connected with terminals of the third segments opposing the second vias.

7. The printed circuit board as claimed in claim 5, wherein the first vias are arranged staggerly in the second direction.

8. The printed circuit board as claimed in claim 7, wherein the first vias connected with the middle one of the first segments in the first direction is the farthest or nearest one of the first vias from the first electronic component in the second direction.

* * * * *